United States Patent
Odnoblyudov et al.

(10) Patent No.: US 12,148,868 B2
(45) Date of Patent: *Nov. 19, 2024

(54) LIGHT EMITTING DIODE CONSTRUCTIONS AND METHODS FOR MAKING THE SAME

(71) Applicant: Bridgelux, Inc., Livermore, CA (US)

(72) Inventors: Vladimir A. Odnoblyudov, Danville, CA (US); R. Scott West, Pleasanton, CA (US)

(73) Assignee: Bridgelux, Inc., Livermore, CA (US)

( * ) Notice: Subject to any disclaimer, the term of this patent is extended or adjusted under 35 U.S.C. 154(b) by 23 days.

This patent is subject to a terminal disclaimer.

(21) Appl. No.: 17/667,428

(22) Filed: Feb. 8, 2022

(65) Prior Publication Data

US 2022/0262994 A1    Aug. 18, 2022

Related U.S. Application Data

(63) Continuation of application No. 16/416,032, filed on May 17, 2019, now Pat. No. 11,245,058, which is a
(Continued)

(51) Int. Cl.
*H01L 33/58* (2010.01)
*H01L 33/62* (2010.01)
*H01L 21/56* (2006.01)

(52) U.S. Cl.
CPC .......... *H01L 33/58* (2013.01); *H01L 21/568* (2013.01); *H01L 33/62* (2013.01); *H01L 2224/18* (2013.01);
(Continued)

(58) Field of Classification Search
CPC .......... H01L 33/58; H01L 33/62; H01L 33/54
See application file for complete search history.

(56) References Cited

U.S. PATENT DOCUMENTS 11,245,058 B2 * 2/2022 Odnoblyudov ......... H01L 33/58
2005/0006651 A1 * 1/2005 LeBoeuf ............... H05K 1/0203
257/79
(Continued)

FOREIGN PATENT DOCUMENTS

WO    WO-2013151387 A1 * 10/2013 ............. H01L 24/96

OTHER PUBLICATIONS

Machine Translation of WO-2013151387, published Oct. 10, 2013.*
(Continued)

*Primary Examiner* — Suberr L Chi
(74) *Attorney, Agent, or Firm* — Snell & Wilmer L.L.P.

(57) ABSTRACT

Light emitting diode (LED) constructions comprise an LED having a pair of electrical contacts along a bottom surface. A lens is disposed over the LED and covers a portion of the LED bottom surface. A pair of electrical terminals is connected with respective LED contacts, are sized larger than the contacts, and connect with the lens material along the LED bottom surface. A wavelength converting material may be interposed between the LED and the lens. LED constructions may comprise a number of LEDs, where the light emitted by each LED differs from one another by about 2.5 nm or less. LED constructions are made by attaching 2 or more LEDs to a common wafer by adhesive layer, forming a lens on a wafer level over each LED to provide a rigid structure, removing the common wafer, forming the electrical contacts on a wafer level, and then separating the LEDs.

19 Claims, 3 Drawing Sheets

Related U.S. Application Data continuation of application No. 14/555,508, filed on Nov. 26, 2014, now Pat. No. 10,297,731.

(52) U.S. Cl.
CPC .. *H01L 2224/19* (2013.01); *H01L 2924/0002* (2013.01); *H01L 2924/181* (2013.01); *H01L 2933/0033* (2013.01); *H01L 2933/005* (2013.01); *H01L 2933/0058* (2013.01); *H01L 2933/0066* (2013.01)

(56) References Cited

U.S. PATENT DOCUMENTS

| | | |
|---|---|---|
| 2008/0153192 A1 | 6/2008 | Grillot et al. |
| 2011/0095413 A1 | 4/2011 | Barth et al. |
| 2013/0193592 A1 | 8/2013 | Peil et al. |
| 2013/0200398 A1 | 8/2013 | Wang et al. |
| 2013/0313005 A1* | 11/2013 | Nakamura ............ H05K 3/42 174/255 |
| 2013/0320293 A1* | 12/2013 | Seo ................ H01L 33/50 438/22 |
| 2014/0077235 A1* | 3/2014 | Kwon ............... H01L 33/58 257/E33.059 |
| 2014/0291611 A1 | 10/2014 | Tseng et al. |
| 2014/0352774 A1 | 12/2014 | Ito et al. |
| 2015/0091035 A1* | 4/2015 | Kim ............... H01L 33/54 257/98 |
| 2015/0102373 A1 | 4/2015 | Lee et al. |
| 2015/0129919 A1 | 5/2015 | Liu et al. |
| 2015/0188005 A1 | 7/2015 | Chang et al. |
| 2015/0316215 A1 | 11/2015 | Togawa |

OTHER PUBLICATIONS

Non-Final Office Action dated Apr. 4, 2016 in corresponding U.S. Appl. No. 14/555,508, filed Nov. 26, 2014; total 15 pages.
Final Office Action dated Jan. 12, 2017 in corresponding U.S. Appl. No. 14/555,508, filed Nov. 26, 2014; total 14 pages.
Advisory Action dated Mar. 31, 2017 in corresponding U.S. Appl. No. 14/555,508, filed Nov. 26, 2014; total 8 pages.
Non-Final Office Action dated May 9, 2017 in corresponding U.S. Appl. No. 14/555,508, filed Nov. 26, 2014; total 16 pages.
Final Office Action dated Nov. 24, 2017 in corresponding U.S. Appl. No. 14/555,508, filed Nov. 26, 2014; total 17 pages.
Advisory Action dated Feb. 16, 2018 in corresponding U.S. Appl. No. 14/555,508, filed Nov. 26, 2014; total 7 pages.
Non-Final Office Action dated Jun. 14, 2018 in corresponding U.S. Appl. No. 14/555,508, filed Nov. 26, 2014; total 17 pages.
Notice of Allowance dated Jan. 11, 2019 in corresponding U.S. Appl. No. 14/555,508, filed Nov. 26, 2014; total 9 pages.
Non-Final Office Action dated Apr. 10, 2020 in corresponding U.S. Appl. No. 16/416,032, filed May 17, 2019; total 15 pages.
Final Office Action dated Oct. 15, 2020 in corresponding U.S. Appl. No. 16/416,032, filed May 17, 2019; total 16 pages.
Advisory Action dated Dec. 22, 2020 in corresponding U.S. Appl. No. 16/416,032, filed May 17, 2019; total 2 pages.
Notice of Allowance dated Oct. 4, 2021 in corresponding U.S. Appl. No. 16/416,032, filed May 17, 2019; total 10 pages.

* cited by examiner

LIGHT EMITTING DIODE CONSTRUCTIONS AND METHODS FOR MAKING THE SAME

CROSS-REFERENCE TO RELATED APPLICATIONS

This patent application is a continuation of U.S. patent application Ser. No. 16/416,032 filed May 17, 2019, now U.S. Pat. No. 11,245,058, which is a continuation of U.S. patent application Ser. No. 14/555,508 filed Nov. 26, 2014, now U.S. Pat. No. 10,297,731, which applications are hereby incorporated by reference in their entirety.

FIELD

Disclosed herein are light emitting diodes, assemblies comprising the same, and methods for making such assemblies constructions and, more specifically, wafer level light emitting diode assemblies and method for making the same.

BACKGROUND

Light emitting diodes (LEDs) are known in the art and are useful for the purpose of meeting the needs of numerous end-use lighting applications. Such LEDs are typically formed on a substrate or wafer containing a number of such LEDs. The wafer is diced to obtain the number of LEDs formed thereon and the separate LEDs are then processed, e.g., to include any wavelength conversion material disposed thereon to obtain a desired wavelength light output, and one or more lenses, and then used to form a desired LED assembly or package comprising a number of the so-formed LEDs. The LEDs in the assembly or package are also electrically connected with one another and configured to make electrical contact with a desired connection substrate.

The above-noted conventional manner of making LED assemblies, by working with the diced or individual LEDs for the purpose downstream processing for making LED constructions useful for including in an LED assembly or package, is not the most effective from a manufacturing perspective. The process of dicing the LEDs, and then processing the separated LEDs through the downstream manufacturing steps needed for making final LED constructions useful for then forming an LED assembly or LED package comprising the same, is one that is cost and labor intensive as a result of such downstream processing for such individual LEDs.

Accordingly, it is desired that LED constructions and method for making the same be developed in a such a manner so as to enable a number of LEDs to be subjected to such downstream manufacturing processing at one time to thereby improve the manufacturing efficiency associated with making the same when compared to the above-described method of making LED constructions. It is further desired that such LED constructions and method for making the same be developed in a manner that optimizes certain properties of the LED constructions and LED assemblies and packaging formed therefrom, including but not limited to obtaining a desired degree of control over the wavelength of light emitted, i.e., white point control from the LEDs within an LED construction and LED assemblies and packaging comprising the same.

BRIEF DESCRIPTION OF THE DRAWINGS

These and other features and advantages of light emitting diode constructions, assemblies comprising the same, and methods for making the same as disclosed herein will be appreciated as the same becomes better understood by reference to the following detailed description when considered in connection with the accompanying drawings.

SUMMARY

Figure 1:
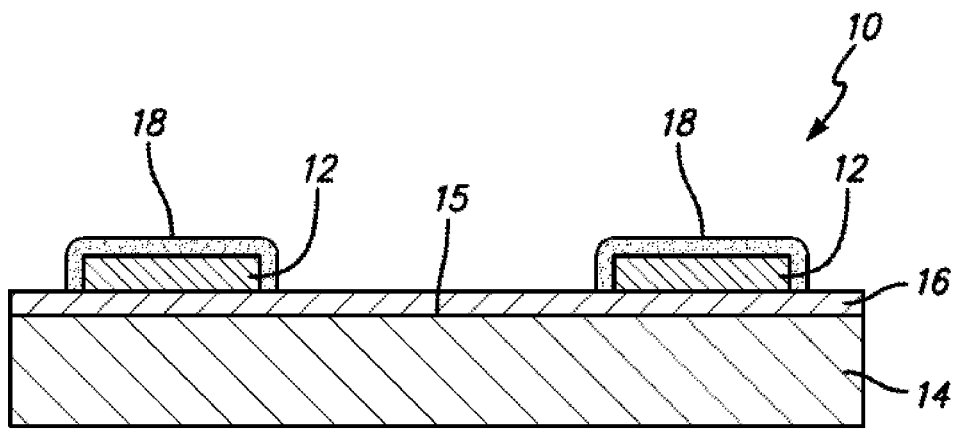
FIG. 1 is a cross-sectional side view of an example light emitting diode construction during an initial step of making as disclosed herein.

Light emitting diode constructions and light emitting assemblies as disclosed herein comprise a light emitting diode comprising a pair of electrical contacts positioned along a bottom surface. A lens is disposed over the light emitting diode, wherein the lens is formed from an optically transparent material that encapsulates top and side surfaces of the light emitting diode. In an example, the optically transparent material is a silicone such as phenyl silicone. In an example, the lens covers a portion of the light emitting diode bottom surface, and may have a hemispherical shape along a top portion.

The assembly further comprises a pair of electrical terminals each connected with a respective light emitting diode electrical contacts, wherein the pair of electrical terminals are greater in size than the respective electrical contacts and are also connected with the optically transparent material. In an example, the electrical terminals may be provided in the form of printed copper. In an example, the assembly may comprise a layer of wavelength converting material such as conformal phosphor interposed between the light emitting diode and the lens. In an example, the lens may comprise a sidewall portion that extends upwardly from the electrical terminals to the hemispherical top portion. In another example, the sidewall portions that extend upward are rectangular and/or contiguous with the hemispherical top portion.

The assembly may comprise two or more of the light emitting diodes each comprising the lens and the electrical terminals, wherein the lenses of the two or more light emitting diodes are connected with one another to form a rigid assembly connecting together the two or more light emitting diodes and facilitating wafer level downstream processing. In an example, the two or more light emitting diodes each emit light at a different wavelength. For example, the wavelength of light emitted by each light emitting diode can differ from one another by about 2.5 nm or less.

Light emitting constructions and assemblies as disclosed herein may be made by disposing two or more light emitting diodes on a common wafer, forming a light conversion material over the two or more light emitting diodes to thereby provide an initial rigid structure for subsequently wafer level forming an optically transparent material over the light conversion material, thereby providing a further level of rigidity to the resulting construction. In an example, the two or more light emitting diodes are attached to the common wafer by an adhesive material interposed therebetween. In an example, the two or more light emitting diodes are selected having a light emission that differs from one another by about 2.5 nm or less. In an example, the optically transparent material is used to form a lens over the light conversion material by compression molding.

The common wafer is removed to expose electrical contacts on the two or more light emitting diodes for facilitating wafer level forming electrical terminals on the two or more light emitting diodes, wherein each electrical terminal is connected with a respective electrical contact and is sized larger than a respective electrical contact and also contacts the optically transparent material. In an example, where the adhesive material used to attach the light emitting diodes is a thermal adhesive, the common wafer is removed by subjecting the construction to an elevated temperature. In an example, the electrical terminals are formed by depositing a metallic material onto the two or more light emitting diodes, wherein the metallic material is deposited in a desired configuration of the electrical terminals. Alternatively, the electrical terminals may be formed by depositing a metallic material onto the two or more light emitting diodes, wherein the metallic material is deposited in excess and a stencil is used to define a desired configuration of the electrical terminals. In an example, the metallic material deposited comprises a binder, and wherein after forming electrical terminals on the two or more light emitting diodes, the deposited metallic material to an elevated temperature to volatize the binder.

The so-partially fabricated device is then treated to separate the rigid structure with electrical contacts into separate light emitting diode packages wherein each package has electrical terminals exposed. In an example, the constructed is separated by sawing the rigid structure into separate light emitting diode packages.

Description

Light emitting diodes (LEDs) and constructions and assemblies comprising the same as disclosed herein make use of LEDs having contacts on a common surface of the LED, which may include but are not limited to LEDs having a flip chip architecture, to promote processing and use in an array assembly and/or packaging for meeting the needs of a particular connection substrate and end-use application. A feature of the LED constructions and methods for making the same as disclosed herein is that they are specifically developed and engineered to promote downstream processing of multiple LEDs on a wafer level, to thereby provide an improved level of manufacturing control and efficiency when compared to the conventional chip level LED construction and processing techniques disclosed above.

In an example embodiment, LEDs useful for making LEDs constructions according to the methods disclosed herein are flip chip LEDs, which may be manufactured to emit light at different wavelengths depending on the particular end-use application. However, it is to be understood that LEDs having other types of architectures may also be used. A feature of such LEDs useful for making LED constructions as disclosed herein is that they be configured to include electrical contacts along a common surface of the LED to thereby promote forming a desired electrical contact with adjacent LEDs in an LED assembly and/or to facilitate forming desired electrical contact with a connection substrate along a common surface of such LEDs.

FIG. 1 illustrates an example LED construction 10 during an initial step of a method of making as disclosed herein. During this initial step, a desired number of LEDs 12 (e.g., two or more) are attached to a carrier or substrate 14. The LEDs 12 comprise electrical contacts (not shown) that are disposed along a common surface of each respective LED, and that are oriented adjacent the carrier or substrate 14. The carrier or substrate 14 as used herein may also be referred to as a wafer and is employed as a temporary member for the purpose of downstream processing of the LEDs disposed therein. A feature of the carrier or substrate is that it be formed from a sufficiently rigid material so as to facilitate downstream processing of the LEDs in a manner that resists unwanted bending, flexing, or distortion as it relates to the position of the LEDs disposed thereon. In an example, the carrier or substrate is formed from silicone, quartz, and the like. Because the wafer is to be removed during a subsequent processing step, it is not necessary that the wafer be optically transparent or have other properties typically associated with making an LED assembly.

In an example, the wafer has a thickness that may vary depending on the particular material that is used. In an example where the wafer is quartz, that thickness of the wafer may be from about 0.2 mm to 1.5 mm, from about 0.5 mm to 1 mm, and in a particular example is approximately 0.7 mm.

The LEDs 12 are attached to the wafer 14 via a removable adhesive 16. In an example, the adhesive can be provided in the form of a preformed layer of adhesive material, or can be provided in a non-preformed form, such as one that is spray or otherwise provided, and that is interposed between the LEDs 12 and a top surface 15 of the wafer 14. In an example, the adhesive is formed from a material that can be treated or otherwise activated to lose its adhesive properties so as to permit the removal of wafer from the LEDs during a downstream processing step. It is desired that the LEDs 12 be removed from the wafer 14 in a manner that does not damage the LEDs or any other features or elements of the LED construction 10 that may exist or be present at the time of such removal process. In an example, the adhesive layer may be formed from a material that loses its adhesive properties upon exposure to heat, ultra-violet radiation, and/or chemical treatment. In an example embodiment, the adhesive that is used is a two-sided adhesive that loses its adhesive properties so as to permit removal of the LEDs from the wafer at an elevated temperature, i.e., is a thermal adhesive, wherein in an example embodiment the temperature is between about 150 to 200° C., and in a particular example is approximately 180° C.

In an example, the adhesive has a thickness that may vary depending on the particular material that is used. In an example, where the adhesive is a thermal adhesive, the adhesive later has a thickness of from about 0.1 mm to 1 mm, from about 0.2 mm to 0.8 mm, and in a particular example has a thickness of approximately 0.3 mm.

The LEDs 12 are positioned onto the wafer in a particular predetermined manner/pattern, i.e., they are spaced apart from one another a predetermined distance, so as to facilitate forming lenses over the number of LEDs during a single downstream manufacturing step as better described below. Thus, the LED construction 10 as illustrated in FIG. 1, and as disclosed herein according to the principles of this concept, is one that is intentionally developed for the purpose of facilitating downstream processing of the LEDs 12 at a wafer level so as to expedite and render more efficient the manufacturing process of making LED constructions comprising the same. In an example embodiment, the LEDs are spaced apart from one another a distance that is from about 0.2 mm to 2 mm, 0.3 mm to 1 mm, and in and in a particular example is approximately 0.5 mm. In a particular embodiment, the LEDs 12 are arranged on the wafer 14 in the form of an array of 2×2, 2×4, 4×4, or more LEDs having the desired spaced apart distance from one another. In some embodiments, the LEDs are disposed on an 8 inch round wafer at a predetermined spacing and substantially covering the entire 8 inch round wafer.

A feature of such wafer level processing provided by the constructions and methods of the concept as disclosed herein is the ability to use LEDs having specific performance characteristics to form the wafer and ultimate LED constructions resulting from downstream wafer level processing. In an example, it is desired that the LEDs selected for such wafer level processing be ones having a similar/controlled wavelength of light output, to thereby provide LED constructions having the same controlled light output or controlled white point. Accordingly, in an example embodiment, it is desired that LEDs useful in making LED constructions as disclosed herein have a tight or narrowly-controlled white point. In an example, the white point of LEDs used herein may be within about a 3 step MacAdam Ellipse or a 2 step MacAdam Ellipse, and in a particular embodiment have a white point of about 3,000K within a 2 step MacAdam Ellipse.

LEDs 12 as used herein may include a layer of conformal wavelength conversion material 18 disposed thereover, which may be in the form of a conformal phosphor layer or the like. In an example, the wavelength conversion material 18 may be disposed over the light emitting surfaces, e.g., the top and/or side surfaces, of the LEDs before the LEDs are attached to the wafer. Alternatively, the layer of wavelength conversion material 18 may be disposed over the LEDs after the LEDs have been adhered to the wafer. In an example embodiment, the LEDs flip chip LEDs and include conformal phosphor 18 disposed over the top and side surfaces of the LEDs 12 after being attached with the wafer 14.

Figure 2:
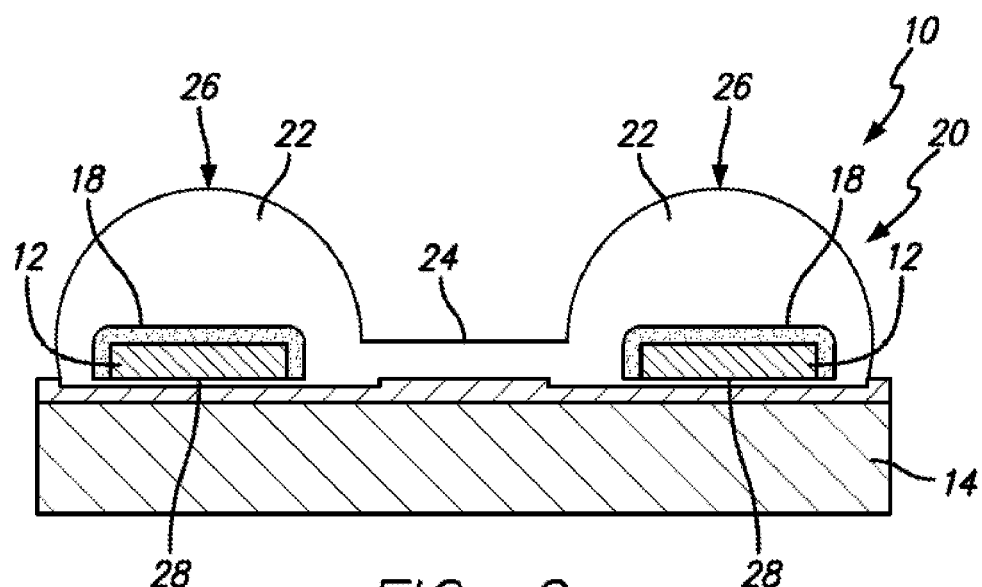
FIG. 2 is a cross-sectional side view of the example light emitting diode construction of FIG. 1 during a subsequent step of making as disclosed herein.

FIG. 2 illustrates an example of the LED construction 10 as illustrated in FIG. 1 and as disclosed above during a subsequent wafer level processing step. Specifically, the LED construction has been further processed to include a lens member 20 disposed over the LEDs 12. In an example, the lens member 20 is configured comprising a number of different lenses or lens elements 22 that are each integral with and interconnected with one another via webs or channels 24 to thereby form a unitary lens member construction. In an example, where the LEDs 12 are provided in the form of an array attached to the wafer 14, the lens member 20 comprises an array of lens elements 22 each disposed over the respective LEDs. The lens elements 22 are disposed over and encapsulate respective LEDs so as to cover the top surface and side surfaces of the respective LED, wherein any layer of wavelength conversion material 18 is interposed therebetween.

In an example, the lens elements 22 each include a dome-shaped or hemispherical portion 26 that is disposed along a top surface of the respective LEDs. The lens elements 22 also include a portion that extends downwardly from the hemispherical portion along a sidewall portion that at least partially covers an underside or bottom surface 28 of the LED, which bottom surface 28 is positioned adjacent the wafer and includes the electrical contacts of the LED. In an example, lens element sidewall portion is rectangular in shape and surrounds the respective LED 12.

The lens member 20 is formed from an optically transparent material and may be selected from those polymeric materials capable of being formed by molding process such as by compression molding. In an example, it is also desired that the material for forming the lens member have a sufficient degree of rigidity because, as described in more detail below, the lens member is used and relied upon once the wafer is removed for keeping the encapsulated LEDs together in the form of a sufficiently rigid structure for further downstream wafer level processing of the LED construction. In an example embodiment, it is desired that the lens member be formed from an optically transparent material having a Shore D hardness of about 30 or more. In an example, the lens member is selected from the group of silicone polymers, and in a particular embodiment is phenyl silicone that is cured at a temperature of approximately 180° C.

It is to be understood that the size and configuration of the lens member 20 and individual lenses or lens elements 22 may vary depending on such factors as the type of LEDs used, the material selected to form the lens member, and/or the particular end-use LED construction lighting application. In an example, the lens elements 22 hemispherical portion 24 have a radius of curvature of from about 0.3 mm to 1 mm, 0.5 to 0.8 mm, and in a particular embodiment approximately 0.5 mm. The lens member web 24 may have a height as measured from a surface of the wafer of from about 30 to 200 microns, 50 to 100 microns, and in a particular embodiment approximately 50 microns.

As mentioned above, in an example the lens member is formed during compression molding process, during which process the LEDs are placed into a volume of the lens material disposed within a respective mold for forming a respective lens element. During this compression molding process an edge of the lens mold is placed into contact with the surface of the adhesive layer 16 and held at an elevated pressure for a length of time useful for the lens material to cure and harden. In an example, prior to attaching the LEDs to the wafer the electrical contacts of the LEDs may be protected or covered with a material such as a tape or the like. Covering the LED electrical contacts in this manner before adhering the LEDs to the wafer may be desired during downstream processing, e.g., such as when the lens member is being formed, to protect the electrical contacts along the bottom surface of the LEDs from being in direct contact with and attached to the lens material.

Figure 3:
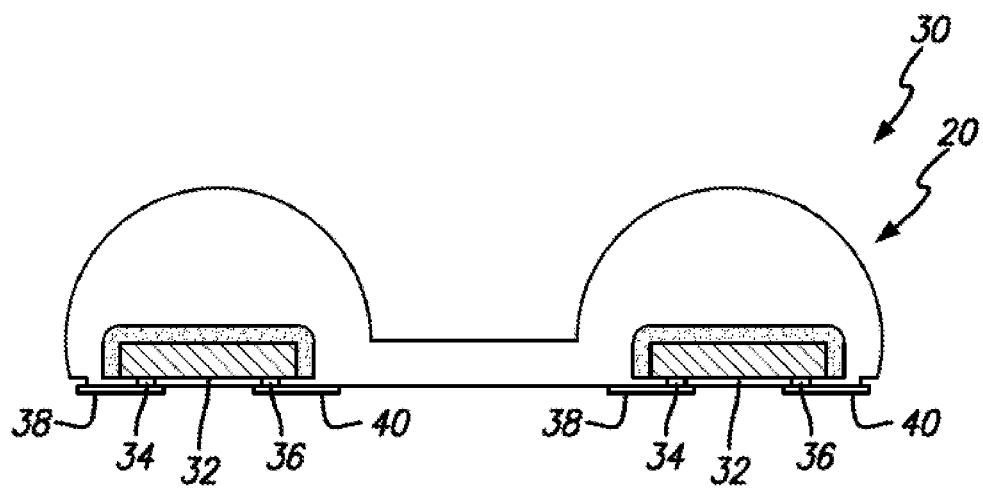
FIG. 3 is a cross-sectional side view of the example light emitting diode construction of FIG. 2 during a subsequent step of making as disclosed herein.
Figure 4:
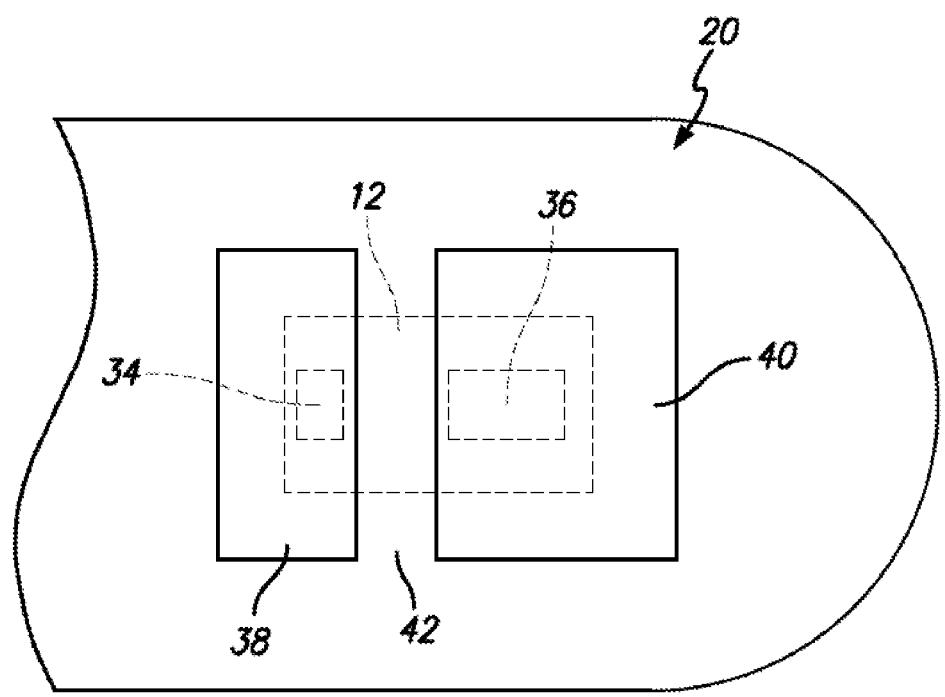
FIG. 4 is a bottom view of an enlarged section of the example light emitting diode construction of FIG. 3 better illustrating some of the features as disclosed herein.

FIGS. 3 and 4 illustrate an example LED construction 30, as illustrated in FIG. 2, at a further stage of wafer-level processing. After forming the lens member 20, the LED construction comprising the wafer is further processed to remove the wafer and adhesive material from the rigid structure/LED construction that now exists and that comprises the LEDs 12 encapsulated in the lens member 20. The wafer 14 is removed from the remaining rigid structure by subjecting the adhesive material to conditions causing it to reduce or lose its adhesive properties. In an example, where a thermal adhesive is used to form the adhesive layer, the adhesive layer is heated to a temperature sufficient to permit removal of the wafer without harming or damaging the remaining LED construction 30. In an example, the adhesive layer is heated to about 180° C. and the rigid construction 30 comprising the LEDs encapsulated in the lens member 20 is removed from the wafer. Once the wafer is removed, the bottom surface 32 of the remaining LED construction 30 may be cleaned and/or otherwise prepared for further processing. In an example where the LED electrical contacts 34 and 36 are covered by tape or other material, such tape or other material is removed for purposes of gaining access to the electrical contacts 34 and 36, e.g., N and P electrical contacts.

Electrical terminals 38 and 40 are formed on the bottom or underside surface 32 of the LED construction 30 during wafer level processing. In an example, the electrical terminals are fanned out and sized having surface area that is greater than the N and P electrical contacts 34 and 36 of the respective LEDs (as best illustrated in FIG. 4) so as to facilitate a desired attachment and electrical connection with other LEDs (e.g., when combined to form an LED assembly) and/or an electrical contact substrate in a particular end-use application. In an example, one of the electrical terminals 38 and 40 may be sized larger than the remaining electrical terminal, e.g., in an example embodiment the electrical terminal 40 that is attached to the P contact 36 of an LED may be sized larger than that of the electrical terminal 38 that is attached to the N contact 34. In an example, the electrical terminals 38 and 40 are sized having an area that is about 50 to 500%, 100 to 300% larger than the LED electrical contacts 34 and 36. In one example, the electrical terminals 38 and 40 are sized having an area that is 300% larger than the LED electrical contacts 34 and 36.

The electrical terminal 38 and 40 are formed by depositing a desired layer thickness of a metallic material onto the underside surface 32 of the LEDs 12 in the LED construction so as to cover and make electrical contact with each of the respective LED N and P electrical contacts 34 and 36. In an example, the metallic material used to form the electrical terminals 38 and 40 is applied to the underside surface 32 of the LED construction 30 in a manner covering each of the respective LED N and P electrical contacts 34 and 36, and also covering the lens material 42 that is adjacent the N and P electrical contacts 34 and 36 and that is covering the underside surface of the LED construction 30 (as best illustrated in FIG. 4). The electrical terminals 38 and 40 may have a thickness of from about 30 to 500 microns, 100 to 200 microns, and in a particular embodiment approximately 100 microns. Metallic materials useful for forming the electrical terminals 38 and 40 include copper, solder, indium containing materials, gold containing materials, and combinations thereof. In an example, the electrical terminals comprise copper.

The process of depositing the metallic material to form the electrical terminals 38 and 40 may be conducted using different techniques. For example, the metallic material can be provided by a jetting or printing process whereby a composition comprising the desired metallic material and a binder is loaded into a machine that is designed to deposit a discrete/precise amount of the material in desired configuration onto the respective P and N electrical contacts in pattern form to thereby form the desired electrical terminals without the need for a stencil or removal of excess deposited material. This technique of printing is one that is very precise and that is similar to dot matrix printing for the purpose of precisely forming the electrical terminals 38 and 40. Once the metallic material is disposed using such method, the deposited material is subjected to an elevated temperature for the purpose of evaporating or flashing off the binder component, thereby leaving the metallic constituent that forms the desired electrical terminals. An advantage of using this process is that the electrical terminals on the LED construction can be formed on the fly without having to perform a subsequent clean-up process, e.g., removing any excess deposited metallic material, before further processing.

In an example, binder materials useful for applying the electrical terminal according to such printing technique may include materials known in the art of metal printing. Polymeric materials that operate to facilitate the desired control of the printing process and that can be removed by thermal process at a temperature that will not damage the remaining LED construction 30 can also be used. In an example, the metallic material is copper, and the binder used in the printing process can be removed by heating to a temperature of about 150° C.

Another technique that may be used to deposit the metallic material for forming the electrical terminals 38 and 40 is one that makes use of a stencil, screen, mask or the like for the purpose of providing the desired configuration of the electrical terminals 38 and 40. Unlike the precise printing process described above, the technique of depositing the metallic material using a stencil is one that is less precise in that it relies on the stencil to provide the desired electrical terminal configuration and excess metallic material is disposed on the stencil and is removed with the stencil during a subsequent process. The metallic and binder materials useful for forming the electrical terminals using such a stencil process may be the same as those noted above, wherein the binder is formed from a material, e.g., an epoxy, that may be removed at a temperature of about 150° C. in a particular embodiment. Once the metallic material is deposited onto the stenciled underside surface of the LED construction, the stencil is removed to remove the excess applied metallic material, and the deposited metallic material is subjected to thermal treatment to remove the binder material.

Another technique that may be used to deposit the metallic material for forming the electrical terminals 38 and 40 is one that may be referred to as a sintering technique. In an example, the sintering technique make use of a metallic composition comprising a binder that is applied using a stencil or the like, as described above, for the purpose of providing the desired configuration of the electrical terminals onto the underside surface of the LED construction. Once deposited, and the stencil is removed, the deposited metallic composition is subjected to an elevated temperature of greater than about 150° C., e.g., about 250° C., for the purpose of quickly removing the binder. In an example, the deposited metallic composition is subjected to such elevated temperature for a short period of time by IR process or the like. An advantage of such sintering technique is that it results in a greater degree of binder material removal, by virtue of the higher temperature treatment, to thereby provide a resulting electrical terminals having a higher metal content, e.g., essentially just comprising the metallic constituent, and having a resulting higher level of electrical conductivity.

Prior to depositing the metallic material, it may be useful to treat the underside surface of the LED construction for the purpose of promoting adhesion of the metallic material use to form the electrical terminals with the lens material. Such treatment may be in the nature of a chemical treatment, thermal treatment, and or a mechanical treatment. For example, an adhesion promoter may be used to promote adhesion, by forming a seed layer or the like, between the silicone lens material and the metallic material.

Figure 5:
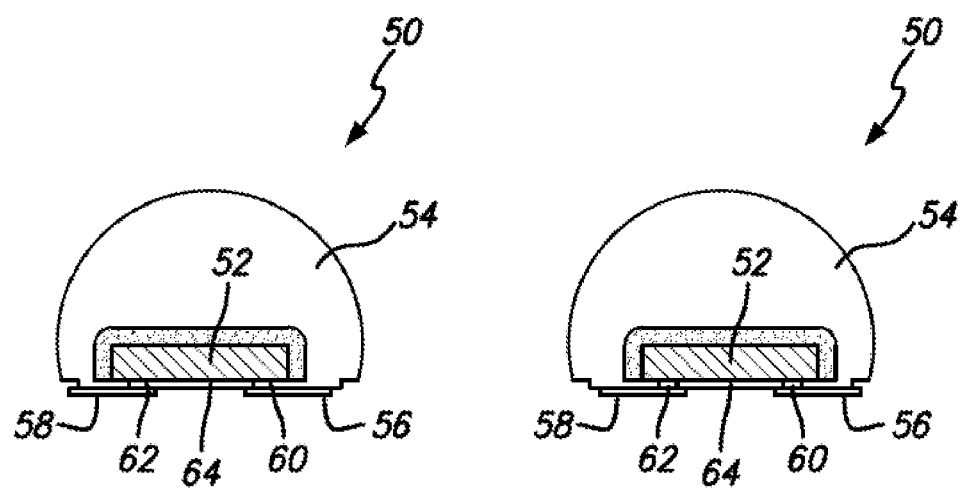
FIG. 5 is a cross-sectional side view of the example light emitting diode construction of FIG. 3 during a subsequent step of making as disclosed herein.

FIG. 5 illustrates LED constructions 50 as disclosed herein during a subsequent step of wafer level processing. Namely, after the electrical terminals are formed to connect with respective LED N and P electrical contacts, the LED construction is further processed to isolate or separate the individual LEDs in the construction. In an example embodiment, the LEDs are diced by conventional technique to form individual LED constructions 50 that each comprise an LED 52 encapsulated by the lens element 54 and comprising the electrical terminals 56 and 58 having a fanned out/expanded surface area (when compared to the respective LED P and N electrical contacts) that are in contact with both the LED P and N electrical contacts 60 and 62 and the lens material disposed along an underside surface 64 of each respective the LED 52.

A feature of LED constructions and methods for forming the same as disclosed herein is that they are specifically formed and developed to facilitate downstream manufacturing of multiple LEDs at a wafer level, e.g., whereby the lens member/lens elements, the expanded electrical terminals, and the individual LED constructions are all processed at a wafer level, rather than at a chip level, to thereby improve manufacturing efficiency and reduce manufacturing cost. A further feature of LED constructions as disclosed herein is the ability to provide a wafer level LED construction for manufacturing processing comprising LEDs having a controlled white point, such that all of the LEDs included in the construction has a tight white point of within 2 step MacAdam Ellipse, and forming completed (with lenses and fanned out electrical contacts) individual LED constructions therefrom that retain such tight white point control.

Although certain specific embodiments of LED constructions and methods for making the same have been described and illustrated for purposes or reference, it is to be understood that the disclosure and illustrations as provided herein not limited to the specific embodiments. Accordingly, various modifications, adaptations, and combinations of various features of the described embodiments can be practiced without departing from the scope what has been disposed herein including the appended claims.

What is claimed is:

1. A light emitting assembly comprising:
    a light emitting diode having first and second electrical contacts disposed along a bottom surface of the light emitting diode;
    a lens disposed over a top surface and one or more side surfaces of the light emitting diode, wherein the lens extends along the bottom surface between the first and second electrical contacts; and
    first and second electrical terminals connected with respective first and second electrical contacts along a portion of a top surface of each respective first and second electrical terminal, wherein the lens is interposed between and in contact with a portion of the top surface of the first and second electrical terminals and the bottom surface of the light emitting diode, wherein each of the first and second electrical terminals comprises a side surface that extends downwardly from the electrical terminal top surface to a bottom most surface of the electrical terminal, and wherein the side surfaces are entirely exposed.

2. The light emitting assembly of claim 1, comprising two light emitting diodes, wherein each light emitting diode comprises the lens, and wherein each lens is integrally connected together forming a one-piece construction.

3. The light emitting assembly of claim 2, wherein a channel extends between each lens, and wherein the channel has a reduced dimension as compared to a remaining portion of each lens as measured from the bottom surface of the two light emitting diodes.

4. The light emitting assembly of claim 1, wherein the first and second electrical terminals only contacts the respective first and second electrical contacts and the lens on the bottom surface of the light emitting diode.

5. The light emitting assembly of claim 1, wherein at least one of the first and second electrical terminals is sized larger than at least one of respective first and second electrical contacts it is connected with.

6. The light emitting assembly of claim 1, wherein the first and second electrical contacts are positioned towards one another and inwardly away from opposed side edges of the light emitting diode.

7. The light emitting assembly of claim 1, wherein the lens is formed from an optically transparent material, and wherein a light conversion material is interposed between at least a portion of the lens and the light emitting diode.

8. A method of making the light assembly of claim 1 comprising:
    disposing the light emitting diode bottom surface onto a temporary substrate;
    disposing an optically transparent material over the light emitting diode top surface, wherein the light emitting diode and optically transparent material form a rigid structure;
    removing the temporary substrate from the light emitting diode, wherein the first and second electrical contacts are disposed along the bottom surface of the light emitting diodes; and
    disposing the first and second electrical terminals on the rigid structure and connecting the first and second electrical terminals with the respective first and second electrical contacts, wherein the optically transparent material is disposed along at least a portion of the bottom surface of the light emitting diode and is interposed between and in contact with the bottom surface of the light emitting diode and one or more of the first and second electrical terminals.

9. The method of claim 8, wherein the rigid structure is formed by curing the optically transparent material to form the lens after the step of disposing the optically transparent material.

10. The method of claim 8, wherein the first and second electrical terminals directly contact only the optically transparent material and the respective first and second electrical contracts.

11. The method of claim 8, further comprising disposing a light conversion material onto the light emitting diode before the step of disposing the optically transparent material.

12. The method of claim 8, wherein at least one of the first and second electrical terminals is sized greater than the respective first or second electrical contact that the at least one of the first and second electrical terminals is connected with.

13. A light emitting assembly comprising:
    two light emitting diodes each comprising a pair of electrical contacts positioned along a bottom surface of each light emitting diode;
    a lens disposed over top and side surfaces of each light emitting diode, wherein the lens of each light emitting diode is integrally connected together forming a one-piece construction; and
    a pair of electrical terminals each connected with the pair of the electrical contacts of each light emitting diode, wherein each electrical terminal has a top surface and a side surface that projects downwardly to an electrical terminal bottom surface, and wherein an entirety of each electrical terminal side surface is exposed;
    wherein the lens is disposed along the bottom surface of the two light emitting diodes between each of the electrical contacts in contact with the top surfaces of the pair of electrical terminals.

14. The light emitting assembly of claim 13, wherein the lens includes a section that extends between each light emitting diode that is configured differently than a portion of the lens that is disposed over the top surface of each light emitting diode.

15. The light emitting assembly of claim 13, wherein the light emitting diodes are separate from one another and positioned adjacent one another, wherein the light emitting diodes are retained in place by the lens extending between the light emitting diodes.

16. The light emitting assembly of claim 13, wherein the lens disposed along the light emitting diode bottom surface extends inwardly from the light emitting diode side surfaces towards the electrical contacts.

17. The light emitting assembly of claim 13, wherein each electrical terminal only contacts a respective light emitting diode electrical contact and the lens disposed along the bottom surface of the light emitting diode.

18. The light emitting assembly of claim 13, wherein the lens is formed from an optically transparent material, and wherein a phosphor material is interposed between at least a portion of the lens and at least one of the light emitting diodes.

19. The light emitting assembly of claim 13, wherein the one or more of the pair of electrical terminals is sized greater than a respective one or more of the electrical contacts.

* * * * *